United States Patent
Harari et al.

(10) Patent No.: US 10,622,377 B2
(45) Date of Patent: Apr. 14, 2020

(54) 3-DIMENSIONAL NOR MEMORY ARRAY WITH VERY FINE PITCH: DEVICE AND METHOD

(71) Applicant: SUNRISE MEMORY CORPORATION, Los Gatos, CA (US)

(72) Inventors: Eli Harari, Saratoga, CA (US); Wu-Yi Henry Chien, San Jose, CA (US); Scott Brad Herner, Lafayette, CO (US)

(73) Assignee: SUNRISE MEMORY CORPORATION, Fremont, CA (US)

( * ) Notice: Subject to any disclaimer, the term of this patent is extended or adjusted under 35 U.S.C. 154(b) by 0 days.

(21) Appl. No.: 16/230,981

(22) Filed: Dec. 21, 2018

(65) Prior Publication Data
US 2019/0206890 A1    Jul. 4, 2019

Related U.S. Application Data

(60) Provisional application No. 62/752,092, filed on Oct. 29, 2018, provisional application No. 62/611,205, filed on Dec. 28, 2017.

(51) Int. Cl.
| | | |
|---|---|---|
| H01L 27/11582 | (2017.01) | |
| H01L 21/768 | (2006.01) | |
| H01L 21/28 | (2006.01) | |
| H01L 27/1157 | (2017.01) | |

(52) U.S. Cl.
CPC .. *H01L 27/11582* (2013.01); *H01L 21/76837* (2013.01); *H01L 21/76843* (2013.01); *H01L 27/1157* (2013.01); *H01L 29/40117* (2019.08)

(58) Field of Classification Search
CPC .................................................. H01L 27/11582
USPC ........................................................... 257/324
See application file for complete search history.

(56) References Cited

U.S. PATENT DOCUMENTS

| | | | |
|---|---|---|---|
| 6,754,105 B1* | 6/2004 | Chang | G11C 16/0475 257/324 |
| 7,512,012 B2* | 3/2009 | Kuo | H01L 29/42348 365/185.26 |
| 8,743,612 B2* | 6/2014 | Choi | G11C 16/0483 365/185.11 |
| 2017/0092370 A1* | 3/2017 | Harari | H05K 999/99 |
| 2017/0092371 A1* | 3/2017 | Harari | G11C 16/3431 |
| 2017/0148517 A1* | 5/2017 | Harari | H01L 21/02532 |

OTHER PUBLICATIONS

"PCT Search Report and Written Opinion, PCT/US2018/067338", dated May 8, 2019.

* cited by examiner

*Primary Examiner* — Jami Valentine Miller
(74) *Attorney, Agent, or Firm* — Edward C. Kwok; VLP Law Group, LLP

(57) ABSTRACT

A method to ease the fabrication of high aspect ratio three dimensional memory structures for memory cells with feature sizes of 20 nm or less, or with a high number of memory layers. The present invention also provides an improved isolation between adjacent memory cells along the same or opposite sides of an active strip. The improved isolation is provided by introducing a strong dielectric barrier film between adjacent memory cells along the same side of an active strip, and by staggering memory cells of opposite sides of the active strip.

46 Claims, 7 Drawing Sheets

3-DIMENSIONAL NOR MEMORY ARRAY WITH VERY FINE PITCH: DEVICE AND METHOD

CROSS REFERENCES TO RELATED APPLICATIONS

The present application is related to and claims priority of (i) U.S. provisional patent application ("Provisional Application I"), Ser. No. 62/611,205, entitled "3-Dimensional NOR Memory Array with Very Fine Pitch: Device and method, filed on Dec. 28, 2017 (ii) U.S. provisional patent application ("Provisional Application II"), Ser. No. 62/752,092, entitled "3-Dimensional NOR Memory Array with Very Fine Pitch: Device and method, filed on Oct. 29, 2018. The disclosures of Provisional Applications I and II (collective, the "Non-Provisional Applications") are hereby incorporated by reference in their entirety.

The present application is also related to (i) U.S. patent application ("Non-Provisional Application I"), Ser. No. 16/107,118, entitled "Capacitive-Coupled Non-Volatile Thin-film Transistor Strings in Three-Dimensional Arrays," filed Aug. 21, 2018; (ii) U.S. patent application ("Non-Provisional Application II"), Ser. No. 16/107,732, entitled "Three-dimensional Vertical NOR Flash Thin-Film Transistor Strings," filed on Aug. 21, 2018; (iii) U.S. patent application ("Non-provisional Application III"), Ser. No. 16/012,731, entitled "3-Dimensional NOR Memory Array Architecture and Methods for Fabrication Thereof," filed Aug. 19, 2018, which claims priority of U.S. provisional patent applications, Ser. Nos., 62/552,661, 62/522,665, 62,622/666, and 62/550,553; (iv) U.S. patent application ("Non-provisional Application IV"), Ser. No. 16/113,296, entitled "Staggered Word Line Architecture for Reduced Disturb in 3-Dimensional NOR Memory Arrays," filed on Aug. 27, 2018, which claims priority of U.S. provisional application, Ser. No. 62/551,110; (v) U.S. patent application ("Non-provisional Application V"), Ser. No. 16/006,573, entitled "3-Dimensional NOR String Arrays in Segmented Stacks," filed on Jun. 12, 2018, which claims priority of U.S. provisional patent application, Ser. No. 62/522,661, filed on Jun. 20, 2017; (vi) U.S. patent application ("Non-provisional Application VI"), Ser. No. 16/006,612, entitled "3-Dimensional NOR String Arrays in Segmented Shared Store Regions," filed on Jun. 12, 2018, which claims priority of U.S. provisional patent application, Ser. No. 62/522,665, filed on Jun. 20, 2017. The disclosures of Non-Provisional Applications I-VI (collectively, the "Non-Provisional Applications") are hereby incorporated by reference in their entireties.

BACKGROUND OF THE INVENTION

1. Field of the Invention

The present invention relates to non-volatile NOR-type memory strings. In particular, the present invention relates to an architecture for a 3-dimensional memory array that allows formation of minimum or sub-minimum pitch vertical conductors without requiring etches involving high aspect-ratios.

2. Discussion of the Related Art

In high density 3-dimensional memory structures, such as those disclosed in the Non-Provisional Applications or the Provisional Applications, it is desirable to make the memory cells as small as possible—thereby increasing the memory cell density—while maintaining a high manufacturing yield. As the size of each memory cell diminishes, the aspect ratio of a feature (e.g., the depth of a trench divided by its horizontal etched gap dimension) increases. In the example of a trench, with the total thickness of the layers etched kept constant, the trench aspect ratio increases as the feature size decreases. An alternative method to increase the memory cell density is to provide more layers of memory cells in the vertical direction. Without changing the etch process, this alternative method necessarily increases the trench aspect ratio. In the current state of the art, when the trench aspect ratio exceeds approximately 50, etching of the trench becomes unreliably difficult or prohibitively costly.

SUMMARY

The present invention provides a method for fabricating a memory structure with minute feature sizes (e.g., 20 nm or less, at the state-of-the art), or with 8 or more layers of memory cells in the memory structure. The present invention also provides an improved isolation between adjacent memory cells along the same and opposite sides of an active strip in the memory structure. The improved isolation is provided by introducing a strong dielectric barrier film between adjacent memory cells along the same side of an active strip, and by staggering memory cells of opposite sides of the active strip. (In this detailed description, the term "active strip" refers to the portion of a horizontal, elongated memory structure that forms the channel regions and the common source and drain regions of a string of memory cells.)

According to another embodiment of the present invention, an improved isolation between adjacent memory cells along the same and opposite sides of a local word line stack in a vertical NOR-string type memory structure with horizontal local word lines. The improved isolation is provided by introducing a strong dielectric barrier film between adjacent memory cells along the same side of a local word line, and by staggering memory cells of opposite sides of the local word line.

The present invention is better understood upon consideration of the detailed description below, in conjunction with the accompanying drawings.

BRIEF DESCRIPTION OF THE DRAWINGS

To facilitate cross-referencing among the figures, like elements are assigned like reference numerals.

DETAILED DESCRIPTION OF THE PREFERRED EMBODIMENTS

The present invention improves memory cell density in memory structures (e.g., 3-Dimensional NOR-type memory arrays) and their manufacturing processes, such as those already disclosed in the Non-Provisional Applications and the Provisional Applications incorporated by reference above. The present invention improves, for example, the 3-dimensional NOR-type memory arrays, and the manufacturing processes thereof, that are disclosed in Non-Provisional Application III, in conjunction with FIGS. 46-54 therein.

Figures 1, 2:
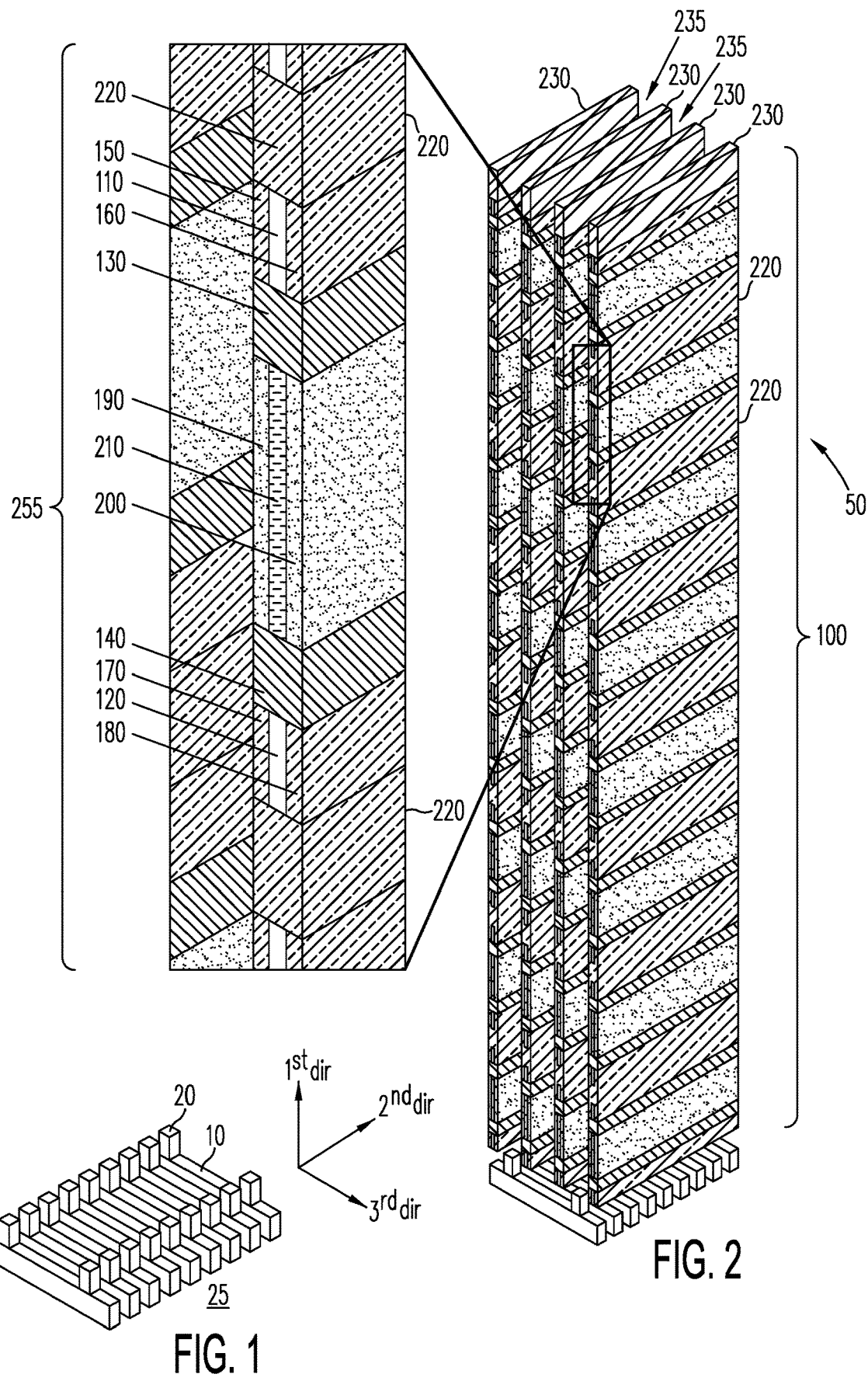
FIG. 1 shows an initial step of forming global interconnect conductors 10 for 3-dimensional NOR-type memory array 50 (not shown), after support circuitry for the memory array (e.g., sense amplifier, address decoders, input and output circuitry) has been formed in semiconductor substrate 5 (not expressly shown), in accordance with one embodiment of the present invention.
FIG. 2 illustrates active stacks formed at an intermediate step in the fabrication of 3-Dimensional NOR-type memory array 50; active stack 100 consists of eight active strips, including active strip 255 which is magnified on the left for greater clarity.

FIG. 1 shows an initial step of forming 3-dimensional NOR-type memory array 50, after support circuitry for the memory array (e.g., sense amplifier, address decoders, input and output circuitry) has been formed in semiconductor substrate 5 (not shown expressly), in accordance with one embodiment of the present invention. As shown in FIG. 1, over the semiconductor substrate 5 is formed inter-layer dielectric (ILD) layer 25. A set of conductors (e.g., conductors 10), mutually electrically isolated from each other, are then formed over ILD layer 25. As conductors 10 are intended for connecting the local word lines of the memory cells in 3-dimensional NOR-type memory array 50 being formed, conductors 10 are referred herein as "global word lines" 10. (Of course, where appropriate, in addition to providing connection to the local word lines of the memory cells, conductors 10 may also serve generally as interconnect conductors for memory structure 50.). Global word lines 10 are each connected to the appropriate circuitry in semiconductor substrate 5 by vias or buried contacts, such that appropriate voltages for memory cell operations (e.g., programming, erase, program-inhibit, read) may be supplied from the circuitry in semiconductor substrate 5. Global word lines 10 may be fabricated using any suitable technique, e.g., a subtractive metal process or a damascene metal process, using a conductive material, such as one or more layers of metal (e.g., Ti/TiN/W) or P$^+$ polysilicon.

Thereafter, a next ILD layer 233 (not shown) is formed covering global word lines 10. Thereafter, vias 20 through ILD layer 233 are formed (e.g., by etching and conductor deposition in ILD layer 233), for example, in a conventional manner. Vias 20 are provided to connect local word lines in 3-D NOR memory array 50 being formed to global word lines 10. Vias 20 may be formed out of the same conductive material as global word lines 10 (i.e., one or more layers of metal (e.g., Ti/TiN/W) or P$^+$ polysilicon). Any excess conductive material may be removed from the top surface of ILD layer 233 by any suitable method (e.g., CMP), leaving only the conductive material in the etched vias.

FIG. 2 shows an intermediate step in the formation of 3-D NOR-type memory array 50, after a number of active stacks (e.g., active stack 100) have been formed. The active stacks are formed by etching deep trenches 235 into the layers of semiconductor and insulating materials that are consecutively deposited over ILD layer 233 of FIG. 1, using such manufacturing processes as those discussed in the Non-provisional Application I, in conjunction with its FIGS. 5a-5h-3 and their accompanying descriptions. In FIG. 2, the active stacks are illustrated by representative active stack 100, with representative active strip 255 in active stack 100 being magnified on the left for greater clarity.

As shown in FIG. 2, active strip 255 includes N$^+$ semiconductor layers 130 and 140 (e.g., silicon or polysilicon), which are provided adjacent metal layers 110 and 120, respectively, provided to reduce resistance in N$^+$ semiconductor layers 130 and 140. Dielectric cladding layers 150, 160, 170, and 180 are provided to electrically insulate metal layers 110 and 120, so as to prevent any unintended short circuit. N$^+$ semiconductor layers 130 and 140, together with their respective metal layers 110 and 120, form a common source sublayer and a common drain sublayer in the string of memory cells being formed along active strip 255. Between N$^+$ semiconductor layers 130 and 140 are formed channel semiconductor layers 190 and 200 on opposite sides of active strip 255. In this embodiment, channel semiconductor layers 190 and 200 are formed by filling cavities resulting from a partial removal of a sacrificial layer ("SAC1"). In fact, the remaining SAC1 layer is shown in FIG. 2 as SAC1 layer 210, between channel semiconductor layers 190 and 200. (In an alternative embodiment, SAC1 layer 210 may be completely removed subsequently, so as to result in an air or vacuum gap in the space where SAC1 layer 210 is now shown; alternatively, channel layers 190 and 200 can be allowed to merge together to fill the space previously occupied by SAC1 layer.)

Adjacent active strips in active stack 100 are insulated from each other by a dielectric layer, as illustrated in FIG. 2 by representative dielectric layer 220. In addition, hard mask layer 230 is provided before trenches 235 between the active stacks are etched. Hard mask layer 230 stabilizes the subsequent active stacks that are formed by the etching. The use of such hard mask layer 230, and further including the use of struts (not shown in FIG. 2), to stabilize high aspect ratio structures, are disclosed in Non-provisional Applications III. In this example, each active strip may have a width of 15 nm to 50 nm (along the 3$^{rd}$ direction, indicated in FIG. 2), and each layer of hard mask 230 may support formation of 8 or more active strips one on top of another in each active stack. As disclosed in Non-provisional Application V, the NOR-type memory array may be built up in "segmented stacks" (i.e., forming stacks of 8 layers of active strips at a time). Using the segmented stacks approach, the manufacturing process steps may be repeated numerous times to form a memory array with 16-, 24-, 32-, 48-, 64- . . . layers of active strips.

In one embodiment, N$^+$ semiconductor layers 130 and 140, metal layers 110 and 120, channel semiconductor layers 190 and 200, and dielectric layer 220 may each be about 180 nm thick, such that the 8 active strips in active stack 100, together with the 50-nm hard mask layer 230, rise to a total height of 1490 nm or higher. With 45 nm wide local word lines 275 and a 45 nm gap or trench between adjacent local word lines, the aspect ratio of the etched trench is 33:1. If active stack 100 has 12 layers of active strips, the trench aspect ratio reaches 49:1.

Figure 3:
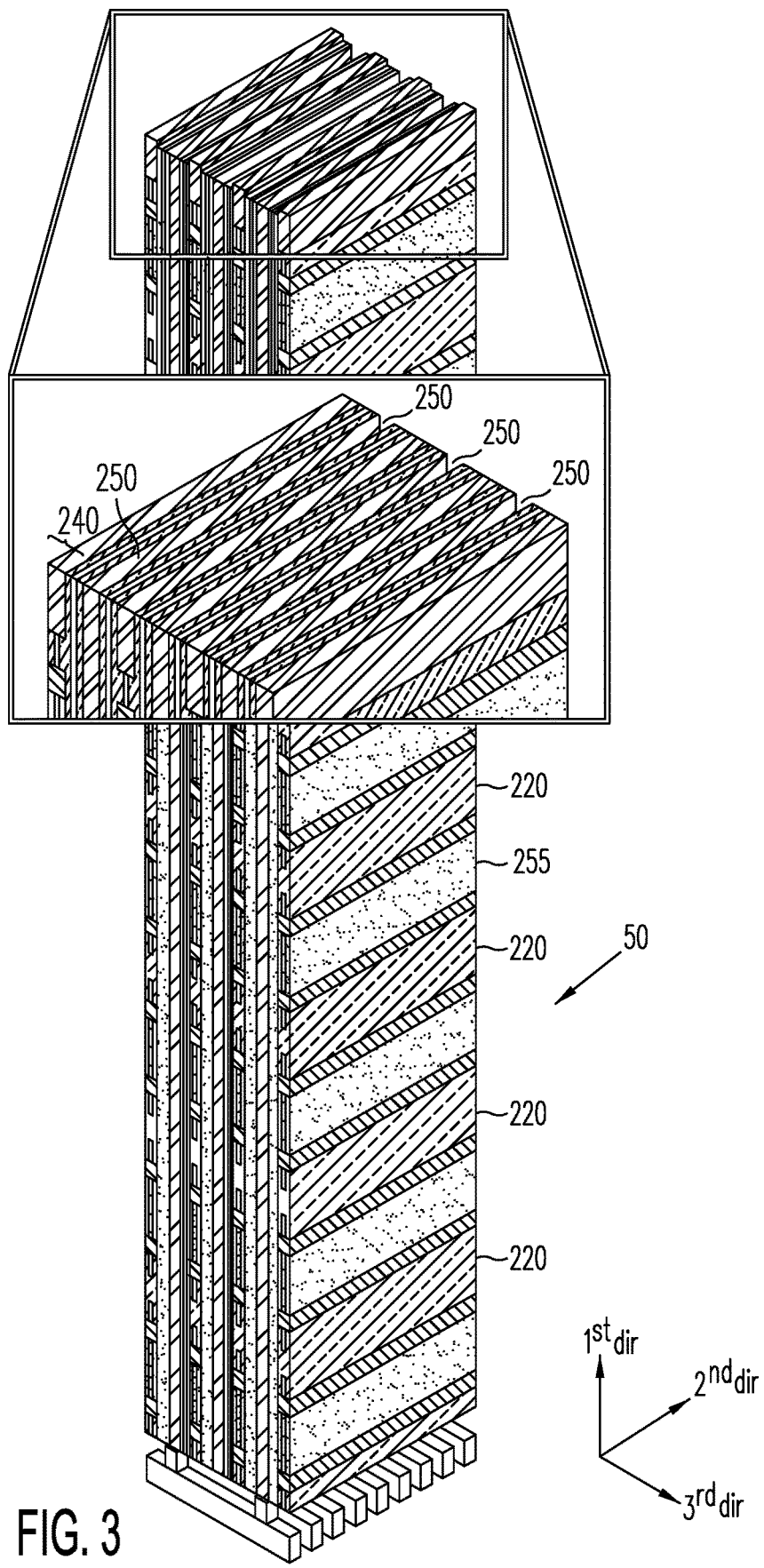
FIG. 3 shows memory structure 50 of FIG. 2, after charge trapping material 240 and P$^+$ semiconductor layer 250 have been deposited and processed, in accordance with one embodiment of the present invention.

Thereafter, over the side walls and bottom of each trench between adjacent active stacks is provided conformally charge-trapping layer 240 (see, e.g., FIG. 3, at inset), which may be a $SiO_2$—SiN—$SiO_2$ triple-layer (i.e., an oxide-nitride-oxide or "ONO" layer). The charge trapping function of an ONO layer is known to those of ordinary skill in the art. Charge-trapping layer 240 may consist of, for example, from less than 3 nm to 6 nm of $SiO_2$ (or a bandgap-engineered dielectric sandwich), 6 nm of SiN and 6 nm of $SiO_2$ (or a dielectric film with a high dielectric constant, such as a $Al_2O_3$ film). After charge-trapping layer 240 is deposited, a 3-nm thick protective polysilicon layer may also be conformally deposited. The portions of charge-trapping layer 240 and the protective polysilicon layer at the bottom of each trench may then be removed to expose vias 20, thereby allowing subsequent connections between global word lines 10 and the local word lines, which are next to be formed. Even though the aspect ratio for this etch is greater than 100, only the about 20 nm thick layer of charge-trapping layer 240 and protective polysilicon layer 250 at the bottom of each trench is removed. Following this etch, $P^+$ semiconductor layer 250 (e.g., silicon or polysilicon), is deposited to fill the remaining exposed trenches 235. FIG. 3 shows memory structure 50 of FIG. 2, after charge trapping material 240 and $P^+$ semiconductor layer 250 have been deposited and processed, in accordance with one embodiment of the present invention. $P^+$ semiconductor layer 250 may be replaced by a metallic conductor (e.g., titanium nitride, titanium, tantalum nitride, tantalum, tungsten nitride, tungsten or another refractive metal having a suitable metal work function relative to $SiO_2$).

Figure 4:
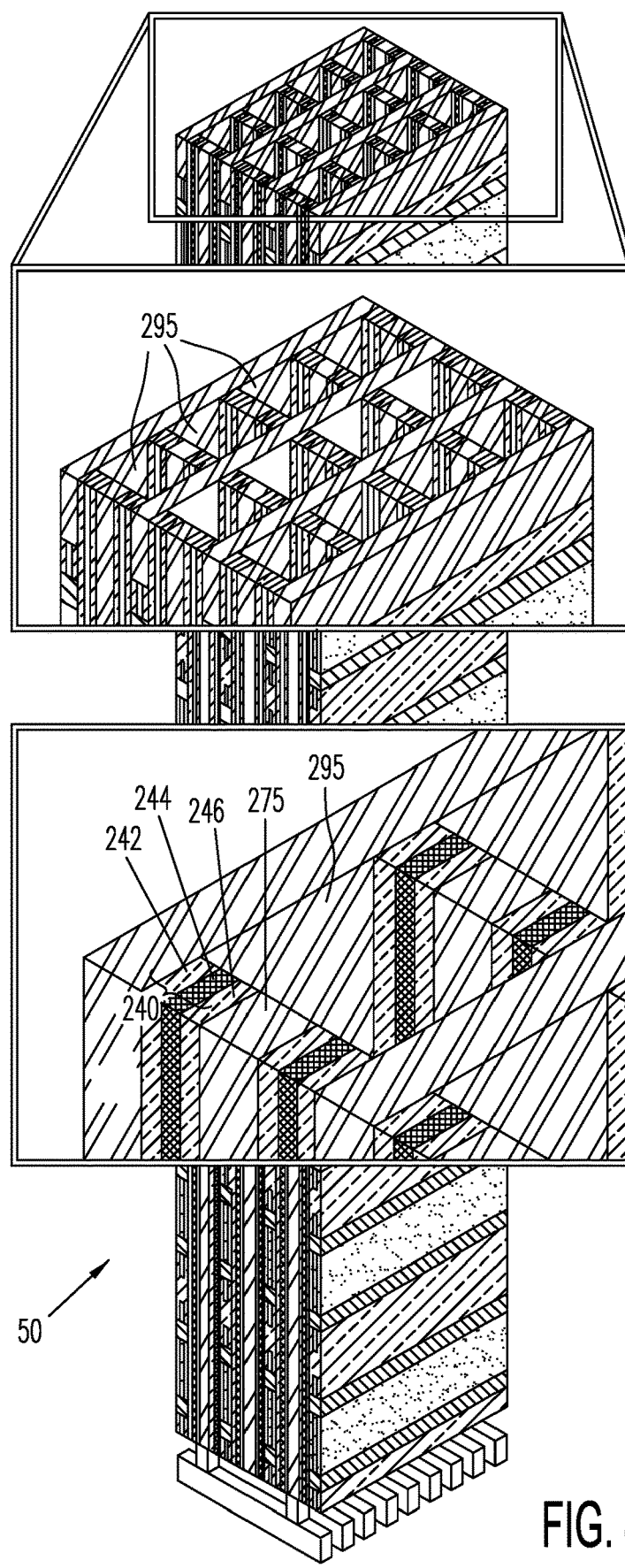
FIG. 4 shows memory structure 50 of FIG. 3, after charge trapping material 240 and P$^+$ semiconductor layer 250 are patterned and etched, thereby forming a first group of the memory cells in 3-Dimensional NOR-type memory array 50, with P$^+$ semiconductor layer 250 providing a first set of vertical local word line conductors 275.
Figure 5:
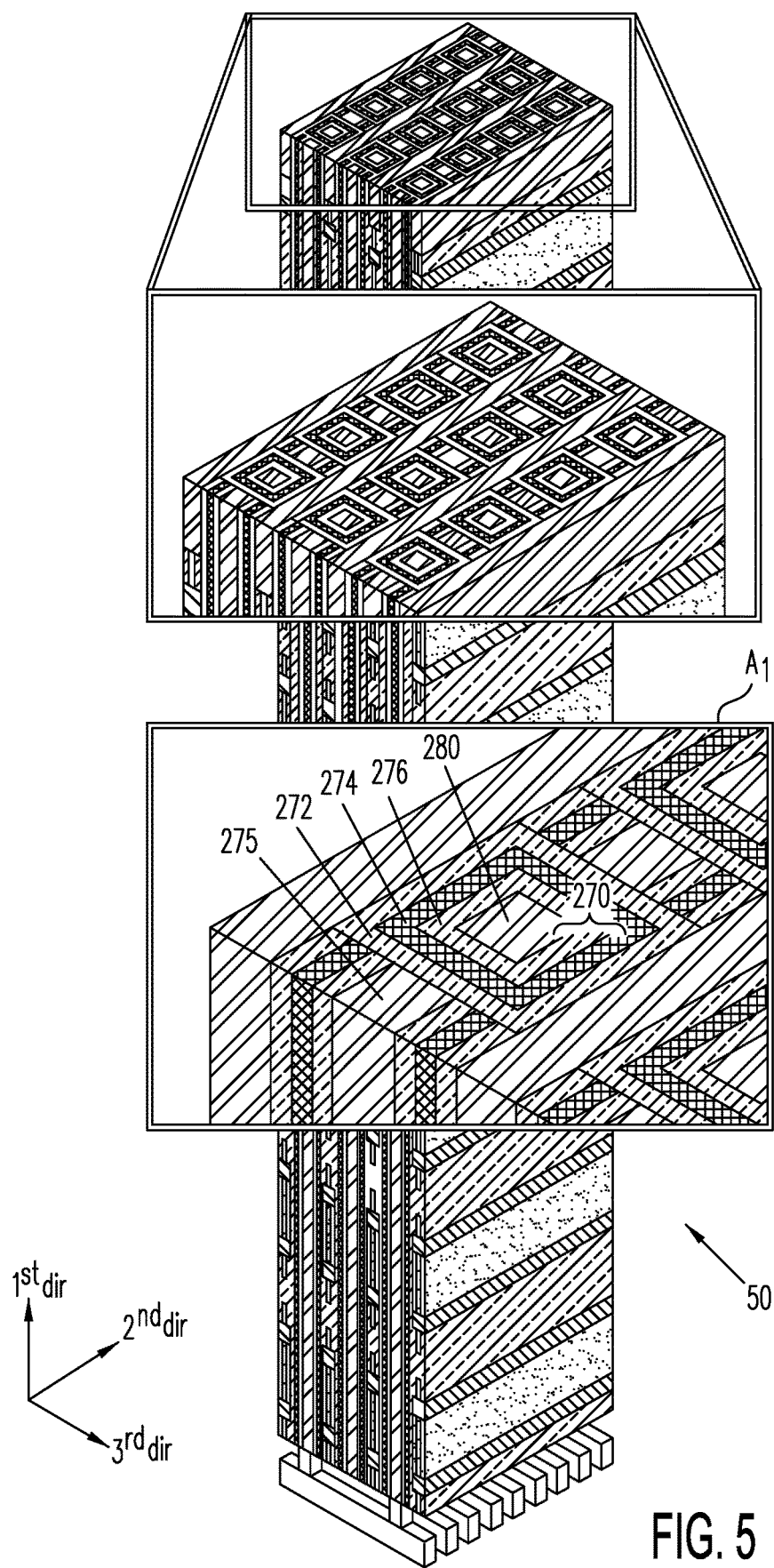
FIG. 5 shows memory structure 50 of FIG. 4, after second charge-trapping layer 270 is conformally deposited onto the side walls of trenches 295 between adjacent local word lines 275 of memory structure 50 of FIG. 4, followed by deposition of a second layer of P$^+$ semiconductor material, which forms second group of local word line conductors 280, in accordance with one embodiment of the present invention.

Charge-trapping layer 240, consisting of a ONO triple-layer (shown as, e.g., tunnel oxide 242, storage nitride 244, blocking oxide 246 in FIG. 4), may be approximately 15 nm thick (as measured along the $3^{rd}$ direction). Charge-trapping layer 240 and $P^+$ semiconductor layer 250 are then patterned and etched (including removal of any residual of the ONO triple-layer in the spaces not protected by local word lines 275) to form a first group of the memory cells in the 3-Dimensional NOR-type memory array, with post-etch $P^+$ semiconductor layer 275 providing a first set of vertical local word lines, as shown in FIG. 4. The resulting separations between adjacent local word lines 275 of the first group (indicated in FIG. 4 as shafts 295) allow a second group of vertical local word lines 280 to be formed therein, with their associated charge-trapping layers 270 (see FIG. 5). In the current example, the width of each shaft (along the $2^{nd}$ direction) may be approximately 75 nm (i.e., the 45-nm width of a local word line plus the 15 nm thickness of ONO triple-layers 270 on each side of local word line 280). The aspect ratio to etch a trench of 75 nm wide is approximately 1490/75=20:1, which is considerably more relaxed compared to the previous 33:1, without the structures of FIGS. 4 and 5. Yet, the local word line pitch (i.e., the line width plus line-to-line spacing) is reduced from the standard pitch of (45+45)=90 nm to (45+45+(2*15))/2=60 nm, which is a one-third reduction of a standard pitch. Although local word lines 275 along opposite sides of each active stack are shown in FIGS. 4 and 5 aligned in the horizontal direction transverse to the length of the active strip (i.e., along the $3^{rd}$ direction), they may also be provided in a staggered fashion, such as taught in Non-provisional Application IV. In the staggered configuration, adjacent memory cells that are on opposite sides of an active strip are situated further apart to reduce parasitic program disturb.

After etching shafts 295 between adjacent ones of the first group of local word lines, a second deposition of a charge-trapping material (e.g., charge-trapping layer 270 of FIG. 5, which may be an ONO triple-layer, including the layers labeled 272, 274 and 276) is conformally deposited onto the side walls of each of shafts 295 next to each of first group of local word lines 275. Following formation of charge-trapping layer 270, a second layer of $P^+$ semiconductor material is deposited to form the second group of local word lines (labeled local word lines 280 in FIG. 5). Portions of charge-trapping layer 270 and local word lines 280 are then removed from the top of the memory structure, thereby completing the second group of the memory cells. The resulting structure is shown in magnified area $A_1$ of FIG. 5, which clearly shows word lines alternating from the first group (i.e., word lines 275) and the second group (i.e., word lines 280), each separated from another by the thickness of the ONO charge-trapping layer 270

Figure 6:
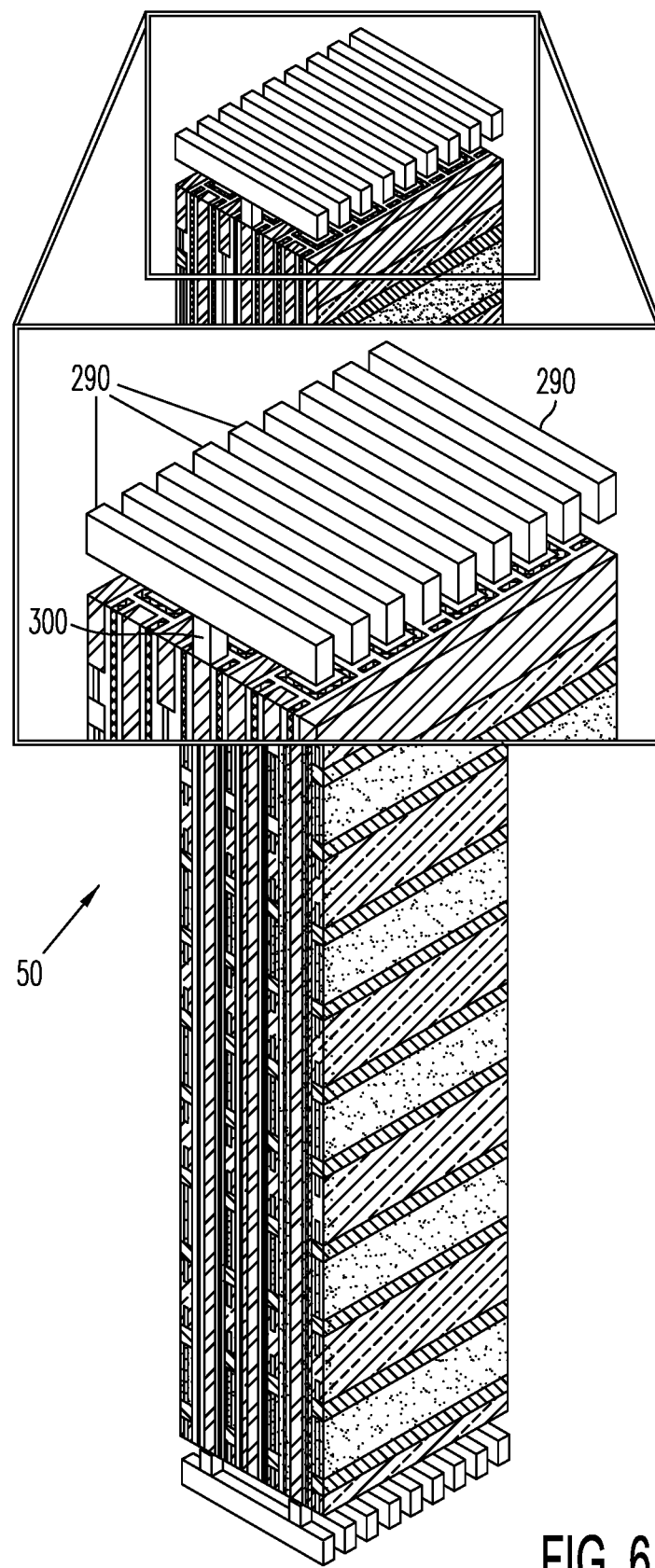
FIG. 6 shows memory structure 50 of FIG. 5, after a second set of global word lines (labeled global word lines 290) and corresponding vias (e.g., vias 300) are formed above the memory structure to connect to local word lines 280, in accordance with one embodiment of the present invention.

Prior to deposition of the second $P^+$ semiconductor layer in advance of forming local word lines 280, the portion of charge-trapping layer 270 at the bottom of the trench may be removed by anisotropic etch to expose vias 20 underneath the memory structure to connect word lines 280 to global word lines 10 (see, global word lines 10 of FIG. 1). However, as discussed below, if a second set of global word lines (e.g., global word lines 290 of FIG. 6) is provided above the memory structure, the portion of charge-trapping layer 270 at the bottom of the trenches need not be removed. A higher density memory structure can be realized by providing global word lines both on top of and beneath memory structure 50. As shown in FIG. 6, global word lines 290 from the top may use vias 300 to contact the local word lines on one side of an active strip while the global word lines beneath memory structure 50 may use vias 20 to contact the local word lines on the opposite side of the active strip. Alternatively, both the first group (i.e., local word lines 275) and the second group (i.e., local word lines 280) can be contacted by global word lines from the top (i.e., conductors 290), or both can be contacted from the bottom (i.e., conductors 10) through appropriately etched vias. Of course, where appropriate, global word lines 290 may also serve generally as interconnect conductors for memory structure 50, in addition to providing connections to local word lines 280.

Depositing charge-trapping layers 240 and 270 in two successive depositions has the important positive effect that the charge-trapping layers of the first and second groups are separate ONO triple-layers. FIG. 5 shows a discontinuity between the ONO triple-layer associated with the first group of local word lines (i.e., layers 242, 244 and 246) and the ONO triple-layer associated with the second group of local word lines (i.e., layers 272, 274, and 276). This discontinuity provides a strong dielectric barrier film (such as provided by blocking oxide layer 272), thereby substantially eliminating the undesirable lateral conduction of charge trapped between adjacent memory cells (i.e., between charge trapped silicon nitride layers 244, associated with the first group of local word lines, and silicon nitride layer 274, associated with the second group of local word lines).

Although charge-trapping layers 240 and 270 are normally deposited to replicate as closely as possible their electrical characteristics, in some embodiments of the present invention charge-trapping layer 240 and charge-trapping layer 270 may be deposited with distinctly different electrical characteristics. For example, charge-trapping layer 240 may be optimized to have maximum long-term data retention, while charge-trapping layer 270 may be separately optimized to provide faster program/erase/read operations. In that arrangement, memory cells associated with charge-trapping layer 270 may be used as cache memory with higher write/erase cycle endurance characteristics (at the cost of a shorter data-retention time). In some embodiments of the current invention the first and second groups of memory cells need not each encompass half of the total number of memory cells in the memory structure.

Figure 7A:
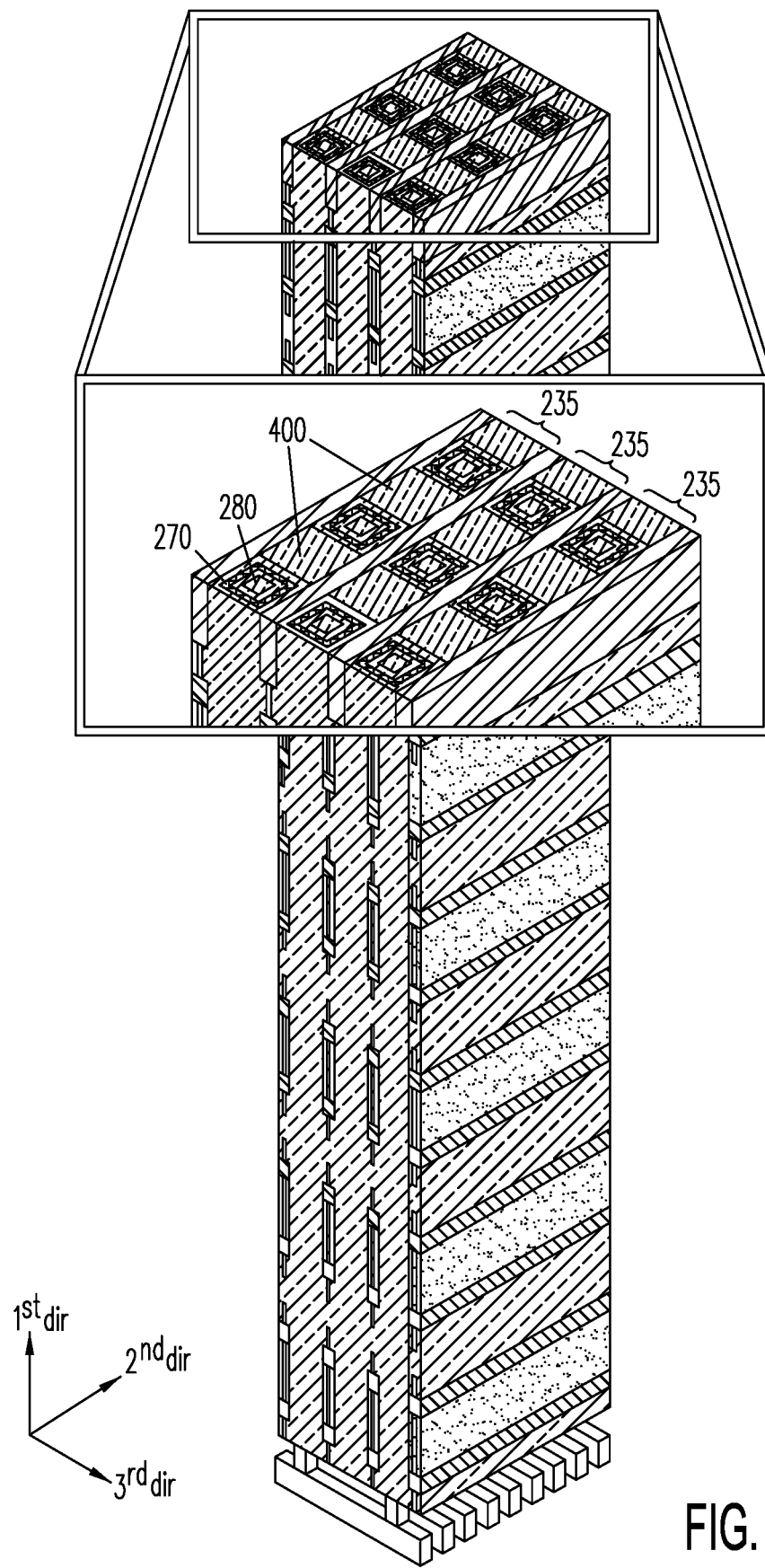
FIGS. 7A and 7B show memory structure 50, according to a second embodiment of the present invention, in which a first group of local word lines and a second group of local word lines are formed successively, both groups of word lines being substantially the same in materials and dimensions.
Figure 7B:
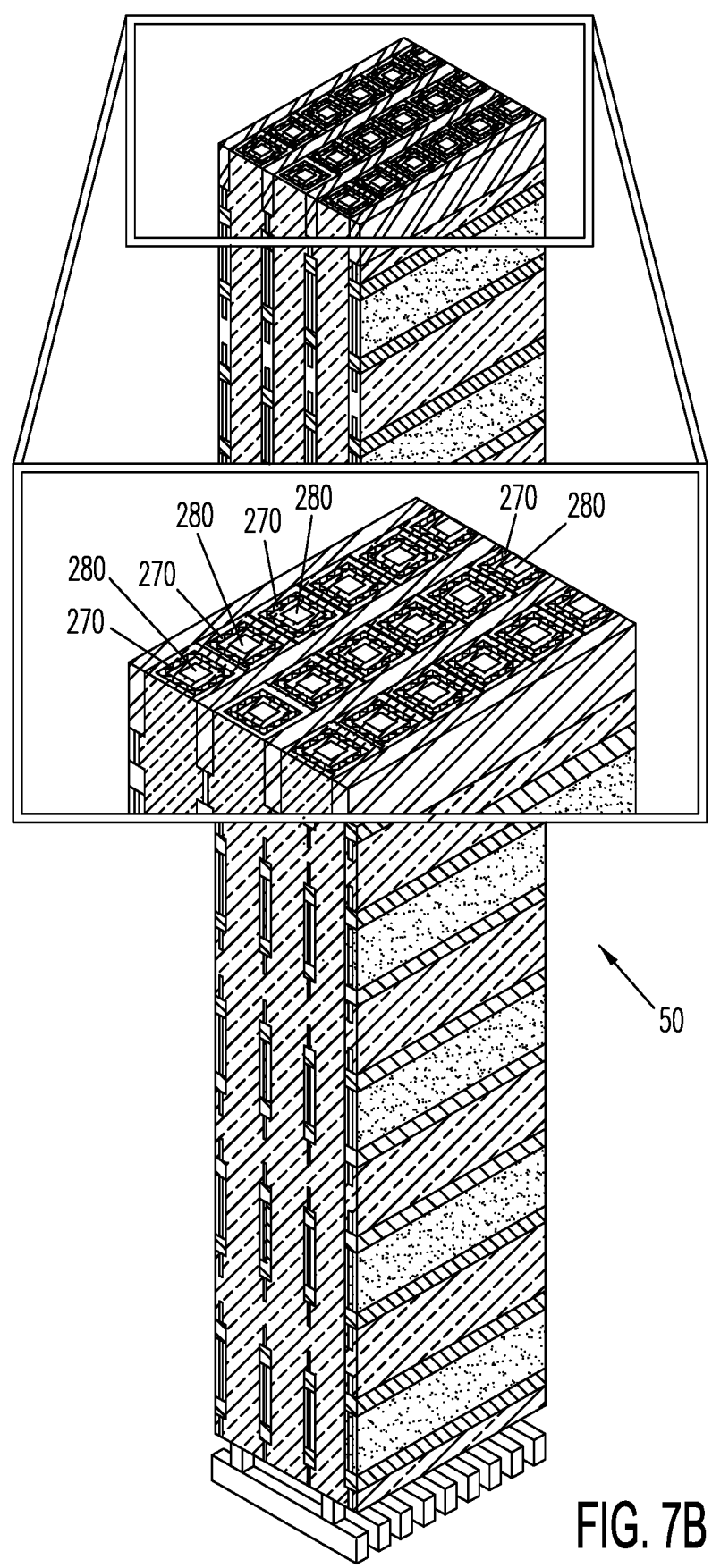

A second embodiment of the present inventions is illustrated in FIGS. 7A and 7B. In this second embodiment, rather than local word lines 275 and their associated charge-trapping layers 240 (see, e.g., FIG. 4), local word lines 280 and their associated charge-trapping layers 270 are used throughout, so that both the first and the second groups of local word lines have substantially the same structures, such as the structure of the second group of local word lines described above.

According to this second embodiment, after forming the active stacks (e.g., active stack 100), as shown in FIG. 2, trenches 235 are filled by depositing a sacrificial material (e.g., a fast-etching dielectric material, such as porous $SiO_2$). This sacrificial material is then patterned and partially etched to form islands 400 of sacrificial material, as indicated by reference number 400 in FIG. 7A, at inset). Each island is separated from each of its neighbors by a shaft (which is shown in FIG. 7A filled in by charge-trapping layer 270 and local word line 280, as discussed next). Each of islands 400 has a predetermined length along the second direction, which is substantially the same as the separation between adjacent ones of islands 400 in each of trenches 235. This separation is sufficient to accommodate the width of a local word line (e.g., the width of one of local word lines 280 of FIG. 5) plus double the thickness of a charge-trapping layer (e.g., charge-trapping layer 270 of FIG. 5), to accommodate charge-trapping layers on both sides of the local word line along the second direction.

Next, a charge-trapping layer is deposited conformally over the side walls and the bottoms of the shafts created in forming islands 400, leaving a void within each shaft, which may then be filled by a conductive material. This charge-trapping layer may be provided substantially by the same material of charge-trapping layer 270 of FIG. 5 (e.g., an oxide-nitride-oxide triple-layer with the constituent layers 272, 274 and 276, respectively). To simplify reference, this charge-trapping layer is labeled 270 in FIG. 7A as well. Similarly, the conductive material filling the void in each shaft may be provided by the same conductive material that forms local word lines 280 of FIG. 5. Again, to simplify reference, this conductive material, which forms a set of conductive columns each surrounded by charge-trapping layer 270; the conductive columns are also referred to as local word lines 280. The conductive material may be selected from a group that includes titanium, titanium nitride, tantalum nitride, tantalum, tungsten nitride, tungsten, cobalt, a heavily-doped $P^+$ or $N^+$ polysilicon, or another refractive metal. The conductive material is then removed from the top surface of the active stacks by CMP or controlled etching.

Conductive columns 280 and their surrounded charge-trapping layer 270 of FIG. 7A are then masked to protect them from the next etching step, which removes islands 400, thereby creating a second set of shafts. (Conductive columns 280 and its surrounding charge-trapping layers 270 are hereinafter referred to as "the first group of local word lines" and "the first charge-trapping layers," respectively.) A second charge-trapping layer is then deposited conformally over the side walls and the bottoms of each of this second set of shafts, leaving a void at the center, which is filled by a column of conductive material, thus forming a second group of local word lines and second charge-trapping layers, respectively. (This second group of local word lines and their surrounding second charge-trapping layers may be provided by the same materials as the first group of local word lines and the first charge layers, respectively.) The substantially identical word lines, alternating between a local word line from the first group and a local word line from the second group of local word lines are shown in FIG. 7B. The remaining process steps to connect the first and second groups of local word lines to global word lines 10 (i.e., the set of global word lines beneath the memory structure; see, e.g., FIG. 1) and global word lines 290 (i.e., the set of global word lines above the memory structure; see, e.g., FIG. 6) follow the corresponding steps described above for the first embodiment.

Both the first embodiment (FIG. 5) and the second embodiment (FIG. 7B) enjoy the same, more favorable etch aspect ratios than the prior art. Both embodiments enjoy favorable physical separation between adjacent local word lines. Although these area-per-cell metrics for both embodiments are smaller than that of the prior art, the area-per-cell metric for the second embodiment is larger than the area-per-cell metric for the first embodiment, as the separation between adjacent local word lines for the second embodiment includes two back-to-back charge-trapping layers (e.g. 2 times 15 nm, in one example), while the corresponding separation in the first embodiment includes only a single such charge-trapping layer (i.e. 15 nm in the same example). The second embodiment, however, has certain compensating advantages over the first embodiment. First, adjacent local word lines and their associated charge-trapping layers in the second embodiment are substantially identical in construction, so that physical characteristics of adjacent local word lines can better-track each other. Second, the first embodiment requires etching of conductive material 275 all the way down the depth of its trench, which can be challenging when conductive material 275 includes a refractive metal. The first embodiment also requires etching clear charge-trapping layers 242, 244 and 246 along the side walls of the trench in the area where conductive material 275 has been removed. These etching steps are not required for defining the first and second groups of word lines in the second embodiment, as the width of a column in each of the groups of word lines in the second embodiment is predetermined by the length of the islands and the thicknesses of the charge-trapping layers.

Although the two-step formation of the local word lines of the present invention requires a greater number of process steps as compared to processes discussed in the Non-Provisional Applications and the Provisional Applications, the present invention provides a reduced-silicon area memory array which, from a cost point of view, can more than compensate the additional required process steps.

The present invention allows formation of multi-layer active stacks that are several microns high, requiring low-resistivity conductors for connecting between the memory cells and the global word lines at the top of the active stacks and logic circuitry in the substrate below the active stacks. As the first or second groups of local word lines of the present invention run along the vertical direction perpendicular to planar surface of the substrate, these local word lines may be adapted to serve more generally as tall interconnects between one or more conductive layers running above the active stacks and one or more conductive layers running between the bottom of the active stacks and the substrate.

The tall interconnects may be formed in the trenches between active strips within the memory array, within dummy active stacks, or within a tall insulating layer (e.g., sacrificial dielectric material 400 of FIG. 7A) that is formed adjacent to the active stacks and given substantially the same height as the active stacks. The dummy active stacks do not themselves serve an electrical purpose, serving merely as an isolation medium to support the tall interconnects, which are patterned as a matrix of closely-spaced rows and columns of via openings (i.e., deep holes that are etched through to the bottom of the dummy active stacks). In the second embodiment, the via opening may be etched, for example, concurrently with etching the second set of trenches, so that the first charge-trapping layer (e.g., an ONO triple-layer) may be deposited on the sidewalls of the via openings conformally as a wall insulator. The deposited first charge-trapping layer at the bottom of the via holes, together with the isolation dielectric layer therebelow, may be masked and removed by an anisotropic etch to expose any required contact vias underneath for subsequent electrical connection.

The via holes may then be filled with a conductive material (e.g., titanium, titanium nitride, tantalum nitride, tantalum, tungsten nitride, tungsten, cobalt or another metallic conductor, such as a refractive metal or a silicide). The excess conductive material on the top surface of the active stacks may be removed by CMP or by a controlled etch (when a damascene-like process is used to isolate individual conductors). An isolation dielectric layer is then deposited on the top surface and vias through this isolation dielectric layer may be patterned and etched to expose the conductive material in the filled via holes underneath where a top-to-bottom conductor path is required.

As a further improvement, the charge-trapping layer surrounding each tall interconnect can be employed to mechanically support and protect the conductive material of the tall interconnect, allowing the sacrificial dielectric material between the interconnects to be removed to create air-gap isolation, thereby significantly reducing the parasitic capacitive coupling between adjacent tall interconnects. Removing the sacrificial dielectric material without etching the charge-trapping layer may be achieved when an etchant is available that has different etch selectivity between the sacrificial dielectric material and the charge-trapping layer. For example, when the sacrificial dielectric material is a porous silicon oxide and the charge-trapping layer includes a silicon nitride, HF may be a suitable chemical etchant, as it removes the sacrificial oxide while leaving essentially intact the silicon nitride. In this manner, even when a tall interconnect leans toward an adjacent tall interconnect, the tall interconnects are electrically insulated from each other by their respective charge-trapping layer acting as cladding.

Providing successive groups of side-by-side local word lines (hence, successive groups of thin-film storage transistors) may also be applicable to three-dimensional vertical thin film transistor memory strings, such as those discussed in related Non-Provisional Application II. For example, FIGS. 6a and 6b of Non-Provisional Application II each disclose vertical NOR strings of thin-film storage transistors (e.g., the vertical NOR string having $N^+$ polysilicon 654 as a common local bit line, $P^-$ polysilicon layer 656 as left and right common channels, and $N^+$ polysilicon 655 as a common local source line). Such vertical NOR strings may be formed in successive operations according to the present invention. First, every alternate row of vertical NOR strings may be formed in a first set of trenches (e.g., the trench between adjacent word lines 623p-R and 623p-L). Then, the other alternate rows of the vertical NOR strings are then formed in the spaces between rows of the vertical NOR strings that have been formed. The charge-trapping layers associated with the first and second groups of vertical NOR strings need not be the same. In that manner, the different groups of vertical NOR strings may have distinctly different storage characteristics.

The above detailed description is provided to illustrate specific embodiments of the present invention and is not intended to be limiting. Numerous variations and modifications of within the scope of the present invention are possible. The present invention is set forth in the accompanying claims.

The invention claimed is:

1. A process for forming a memory structure, comprising:
   forming a plurality of active stacks above a planar surface of a semiconductor substrate, wherein (i) each active stack comprises a plurality of active strips stacked along a first direction substantially perpendicular to the planar surface, electrically isolated from each other by dielectric layers, (ii) each active strip comprises a plurality of semiconductor layers, and (iii) the active stacks each extend lengthwise along substantially a second direction that is parallel to the planar surface, with adjacent active stacks being separated from each other by a first set of trenches each of a predetermined width, as measured along a third direction, which is also substantially parallel to the planar surface;
   forming in the first set of trenches a first group of conductors extending along the first direction, each conductor comprising a first conductive material and each conductor being isolated from its adjacent active stacks by a layer of a first charge-trapping material, wherein the conductors within each trench are separated from each other by a predetermined distance; and
   forming a second group of conductors extending along the first direction, wherein each conductor in the second group of conductors being provided between two adjacent ones of the first group of conductors, each conductor of the second group of conductors comprising a second conductive material and each conductor in the second group of conductors being isolated from its adjacent active stacks by a layer of a second charge-trapping material; and
   wherein the semiconductor layers of each active strip provide a common source region, a common drain region and a plurality of channel regions, such that the common source region, the common drain region, each channel region, a conductor adjacent the channel region in the first or the second group of conductors, and a charge-trapping layer between the channel region and the conductor form a thin-film storage transistor.

2. The process of claim 1, wherein forming the first group of conductors comprises:
   forming the first charge-trapping layer conformally over the side walls of the first set of trenches, leaving a space enclosed by the first charge-trapping layer in each of the first set of trenches;
   filling the space by the first conductive material;
   patterning and etching the first conductive material in each space to form the first group of conductors, such that adjacent ones of the first group of conductors are separated along the second direction by the predetermined distance.

3. The process of claim 2, wherein forming the second group of conductors comprises:
removing the first charge-trapping layer within the predetermined distance separating adjacent ones of the first group of conductors to form a second set of trenches;
forming the second charge-trapping layer conformally over the sidewalls of the second set of trenches, leaving a space surrounded by the second charge-trapping layer within each of the second set of trenches; and
filling the space surrounded by the second charge-trapping layer in each of the second set of trenches with the second conductive material to form the second group of conductors.

4. The process of claim 1, wherein forming the first group of conductors comprises:
depositing a sacrificial material to fill the first set of trenches;
patterning and etching the sacrificial material to form a second set of trenches, each of the second set of trenches being separated by a remaining portion of the sacrificial material;
forming the first charge-trapping layer conformally over the sidewalls of the second set of trenches, leaving a space surrounded by the first charge-trapping layer within each of the second set of trenches; and
filling the space surrounded by the first charge-trapping layer in each of the second set of trenches with the first conductive material to form the first group of conductors.

5. The process of claim 4, wherein forming the second group of conductors comprises:
removing the remaining portions of the sacrificial material to form a third set of trenches;
forming the second charge-trapping layer conformally over the sidewalls of the third set of trenches, leaving a space surrounded by the second charge-trapping layer within each of the third set of trenches; and
filling the space surrounded by the second charge-trapping layer in each of the third set of trenches with the second conductive material to form the second group of conductors.

6. The process of claim 1, wherein at least one the first and second conductive materials is a metallic conductor.

7. The process of claim 1, wherein at least one the first and second conductive materials comprise a refractory metal.

8. The process of claim 1, wherein at least one the first and second conductive materials is selected from a group consisting of titanium, titanium nitride, tantalum nitride, tantalum, tungsten nitride, tungsten, cobalt, heavily-doped $P^+$ polysilicon, heavily-doped $N^+$ polysilicon, and silicides.

9. The process of claim 1, wherein at least one of the first and second charge-trapping layers comprises an oxide-nitride-oxide triple-layer.

10. The process of claim 1, wherein the conductors formed on opposite sides of each active stack along a line extending along the third direction belong to different ones of the first and second groups of conductors.

11. The process of claim 1, wherein the first charge-trapping layer and the second charge-trapping layer have substantially the same charge-trapping characteristics.

12. The process of claim 1, wherein the first charge-trapping layer and the second charge-trapping layer have substantially different charge-trapping characteristics.

13. The process of claim 1, further comprising forming a first system of global interconnect conductors in an insulation layer between the memory structure and the planar surface of the semiconductor substrate and wherein the process further comprises removing portions of insulation layer and, adjacent to the insulation layer, either the first charge-trapping layer, the second charge-trapping layer, or both, to expose the corresponding portions of global interconnect conductors, to allow connections to the first group of conductors, the second group of conductors, or both.

14. The process of claim 13, further comprising forming a second system of global connectors above the memory structure, such that the connections allow the first system of global interconnect conductors to be electrically interconnected to the second system of the global interconnect conductors.

15. The process of claim 14, wherein at least a portion of the second system of global interconnect conductors are electrically connected to circuitry formed in the semiconductor substrate.

16. The process of claim 1, wherein selected conductors in the first and the second group of conductors are each provided a lower resistivity by virtue of its length along the second direction than any of the conductors—other than the selected conductors—in the first and the second groups of conductors.

17. The process of claim 16, wherein each of the selected conductors is part of a via interconnect, a portion of a pre-charge thin-film transistor, a decode selecting thin-film transistor, or another thin-film transistor used for a non-storage purpose.

18. The process of claim 1, wherein the first group of conductors each have a first predetermined width along the second direction, the second group of conductors each have a second predetermined width along the second direction, and the second charge-trapping layer has a third predetermined width along the second direction, wherein the first predetermined width is less than twice the third predetermined width plus the second predetermined width.

19. The process of claim 1, wherein each conductor in the first group of conductors is electrically insulated from at least one conductor in the second group of conductors by the second charge-trapping layer.

20. The process of claim 1, further comprising providing a hard-mask material above the active stacks for protection during any etching steps carried out during forming the first group of conductors or forming the second group of conductors.

21. A memory structure, comprising:
a plurality of active stacks above a planar surface of a semiconductor substrate, wherein (i) each active stack comprises a plurality of active strips stacked along a first direction substantially perpendicular to the planar surface, electrically isolated from each other by dielectric layers, (ii) each active strip comprises a plurality of semiconductor layers, and (iii) the active stacks each extend lengthwise along substantially a second direction that is parallel to the planar surface, with adjacent active stacks being separated from each other by a first set of trenches each of a predetermined width, as measured along a third direction, which is also substantially parallel to the planar surface;
in the first set of trenches, a first group of conductors each extending lengthwise along the first direction, each conductor comprising a first conductive material and each conductor being isolated from its adjacent active stacks by a layer of a first charge-trapping material, wherein the conductors within each trench are separated from each other by a predetermined distance; and
a second group of conductors each extending lengthwise along the first direction, wherein each conductor in the second group of conductors being provided between two adjacent ones of the first group of conductors, each conductor of the second group of conductors comprising a second conductive material and each conductor in the second group of conductors being isolated from its adjacent active stacks by a layer of a second charge-trapping material; and
wherein the semiconductor layers of each active strip provide a common source region, a common drain region and a plurality of channel regions, such that the common source region, the common drain region, each channel region, a conductor adjacent the channel region in the first or the second group of conductors, and a charge-trapping layer between the channel region and the conductor form a thin-film storage transistor.

22. The memory structure of claim 21, wherein each conductor in the first group of conductors is immediately adjacent a portion of the second charge-trapping layer that is adjacent to a conductor in the second group of conductors.

23. The memory structure of claim 22, wherein the conductor in the second group of conductors is surrounded by the second charge-trapping layer.

24. The memory structure of claim 21, wherein the first group of conductors each comprise a conductor surrounded by the first charge-trapping layer.

25. The memory structure of claim 24, wherein the second group of conductors each comprise a conductor surrounded by the second charge-trapping layer.

26. The memory structure of claim 21, wherein at least one the first and second conductive materials is a metallic conductor.

27. memory structure of claim 21, wherein at least one the first and second conductive materials comprise a refractory metal.

28. The memory structure of claim 21, wherein at least one the first and second conductive materials is selected from a group consisting of titanium, titanium nitride, tantalum nitride, tantalum, tungsten nitride, tungsten, cobalt, heavily-doped P$^+$ polysilicon, heavily-doped N$^+$ polysilicon, and silicides.

29. The memory structure of claim 21, wherein at least one of the first and second charge-trapping layers comprises an oxide-nitride-oxide triple-layer.

30. The memory structure of claim 21, wherein the conductors formed on opposite sides of each active stack along a line extending along the third direction belong to different ones of the first and second groups of conductors.

31. The memory structure of claim 21, wherein the first charge-trapping layer and the second charge-trapping layer have substantially the same charge-trapping characteristics.

32. The memory structure of claim 21, wherein the first charge-trapping layer and the second charge-trapping layer have substantially different charge-trapping characteristics.

33. The memory structure of claim 21, further comprising a first system of global interconnect conductors in an insulation layer between the memory structure and the planar surface of the semiconductor substrate and wherein portions of insulation layer and, adjacent the insulation layer, either the first charge-trapping layer, the second charge-trapping layer, or both, are removed to expose the corresponding portions of global interconnect conductors, to allow connections to the first group of conductors, the second group of conductors, or both.

34. The memory structure of claim 33, further comprising a second system of global connectors above the memory structure, such that the connections allow the first system of global interconnect conductors to be electrically interconnected to the second system of the global interconnect conductors.

35. The memory structure of claim 34, wherein at least a portion of the second system of global interconnect conductors are electrically connected to circuitry formed in the semiconductor substrate.

36. The memory structure of claim 21, wherein selected conductors in the first and the second group of conductors are each provided a lower resistivity by virtue of its length along the second direction than any of the conductors—other than the selected conductors—in the first and the second groups of conductors.

37. The memory structure of claim 36, wherein each of the selected conductors is part of a via interconnect, a portion of a pre-charge thin-film transistor, a decode selecting thin-film transistor, or another thin-film transistor used for a non-storage purpose.

38. The memory structure of claim 21, wherein the first group of conductors each have a first predetermined width along the second direction, the second group of conductors each have a second predetermined width along the second direction, and the second charge-trapping layer has a third predetermined width along the second direction, wherein the first predetermined width is less than twice the third predetermined width plus the second predetermined width.

39. The memory structure of claim 21, wherein each conductor in the first group of conductors is electrically insulated from at least one conductor in the second group of conductors by the second charge-trapping layer.

40. The memory structure of claim 21, further comprising a hard-mask material above the active stacks for protection during any etching steps carried out during forming the first group of conductors or forming the second group of conductors.

41. A process for forming vertical high-aspect ratio electrical conductors above an isolation layer provided adjacent a surface of a semiconductor substrate, comprising:
aniostropically etching a plurality of openings in either a three-dimensional memory structure or a sacrificial insulating layer;
depositing a first dielectric layer conformal to the vertical sidewalls of each of the openings, such that the opening is reduced in size by virtue of being surrounded by a wall of the dielectric layer,
removing the first dielectric layer from a floor of each reduced-in-size opening and creating via openings in the isolation layer; and
filling the voids with a barrier metallic material and a first conductive material, thereby forming the vertical electrical conductors, each vertical electrical conductor being clad in the first dielectric layer.

42. The process of claim 41, wherein the vertical electrical conductors are arranged as a two-dimensional array in a horizontal cross section.

43. The process of claim 41, further comprising:
removing any first conductive material above the memory structure or the sacrificial insulating layer by chemical mechanical polishing or a controlled selective etch;
depositing a horizontal insulating layer above the vertical electrical conductors; and
etching via openings in the horizontal insulating layer above selected ones of the vertical electrical conductors.

44. The process of claim 43, further comprising:
   filling the via openings with a second conductive material; and
   forming above the horizontal insulating material a system of interconnection conductors to selectively electrically connect the second conductive material in the filled via openings.

45. The process of claim 44, wherein selected ones of the interconnection conductors are electrically connected to circuitry formed in in the semiconductor substrate.

46. The process of claim 43, wherein the sacrificial insulating layer is removed using a selective etch that preserves the insulating layer cladding the vertical electrical conductors, thereby providing gap insulation between adjacent cladded vertical electrical conductors.

* * * * *